US011342392B2

(12) United States Patent
Tang et al.

(10) Patent No.: US 11,342,392 B2
(45) Date of Patent: May 24, 2022

(54) DISPLAY PANEL AND MANUFACTURING METHOD THEREOF

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guoqiang Tang, Beijing (CN); Xiaojin Zhang, Beijing (CN); Guoqiang Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/642,580

(22) PCT Filed: Mar. 18, 2019

(86) PCT No.: PCT/CN2019/078556
§ 371 (c)(1),
(2) Date: Feb. 27, 2020

(87) PCT Pub. No.: WO2020/186428
PCT Pub. Date: Sep. 24, 2020

(65) Prior Publication Data
US 2021/0151524 A1 May 20, 2021

(51) Int. Cl.
*H01L 27/30* (2006.01)
*H01L 27/32* (2006.01)
(Continued)

(52) U.S. Cl.
CPC ........ *H01L 27/3234* (2013.01); *G06F 3/0421* (2013.01); *G06V 40/1318* (2022.01);
(Continued)

(58) Field of Classification Search
CPC ............... H01L 27/3234; H01L 27/307; H01L 27/3248; H01L 51/504; H01L 27/30;
(Continued)

(56) References Cited

U.S. PATENT DOCUMENTS

2010/0321341 A1 12/2010 Cho et al.
2011/0043486 A1* 2/2011 Hagiwara ............... G06F 3/042
345/175
(Continued)

FOREIGN PATENT DOCUMENTS

CN 102362552 A 2/2012
CN 106156753 A 11/2016
(Continued)

*Primary Examiner* — Fazli Erdem
(74) *Attorney, Agent, or Firm* — Dilworth & Barrese, LLP.; Michael J. Musella, Esq.

(57) ABSTRACT

A display panel and a manufacturing method thereof are disclosed. The display panel includes: a base substrate; a first sub-pixel disposed on the base substrate and including a first light-emitting device configured to emit visible light for display operation; a second a light-emitting device overlapped with the first light-emitting device in a direction perpendicular to the base substrate and configured to emit infrared light; and a first photosensitive device disposed on the base substrate and configured to sense light obtained after the infrared light is reflected.

19 Claims, 5 Drawing Sheets

(51) Int. Cl.
*G06V 40/13* (2022.01)
*H01L 51/50* (2006.01)
*G06F 3/042* (2006.01)

(52) U.S. Cl.
CPC .......... *H01L 27/307* (2013.01); *H01L 51/504* (2013.01); *H01L 27/3248* (2013.01)

(58) Field of Classification Search
CPC ....... H01L 27/32; H01L 27/323; H01L 51/50; G06F 3/04; G06F 3/0424; G06V 40/13; G06V 40/1318
USPC .......................................................... 257/71
See application file for complete search history.

(56) References Cited

U.S. PATENT DOCUMENTS

| | | | | |
|---|---|---|---|---|
| 2012/0249490 A1* | 10/2012 | Lee | ................... | G06F 3/0321 345/179 |
| 2013/0228764 A1 | 9/2013 | Sasaki | | |
| 2014/0300589 A1* | 10/2014 | Tanaka | ................... | G06F 3/0321 345/179 |
| 2015/0042625 A1* | 2/2015 | Yamada | .............. | G06F 3/03542 345/179 |
| 2021/0036047 A1* | 2/2021 | Heo | ................... | H01L 27/3209 |
| 2021/0173252 A1* | 6/2021 | Jiang | ................ | G02F 1/133602 |

FOREIGN PATENT DOCUMENTS

| | | |
|---|---|---|
| CN | 107680988 A | 2/2018 |
| CN | 108054190 A | 5/2018 |
| CN | 108288639 A | 7/2018 |

* cited by examiner

DISPLAY PANEL AND MANUFACTURING METHOD THEREOF

TECHNICAL FIELD

The embodiments of the present disclosure relate to a display panel and a manufacturing method thereof.

BACKGROUND

In the display field, organic light-emitting diode (OLED) display panels have the characteristics of autoluminescence, high contrast, low energy consumption, wide viewing angle, fast response speed, capability of being applied in flexible panels, wide temperature range, simple manufacturing process and the like and have broad development prospects. With the development of the fingerprint recognition technology, how to apply the fingerprint recognition technology to OLED display panels is an issue that has attracted much attention in the industry.

SUMMARY

At least some embodiments of the present disclosure provide a display panel, comprising: a base substrate; a first sub-pixel disposed on the base substrate and including a first light-emitting device configured to emit visible light for display operation; a second a light-emitting device overlapped with the first light-emitting device in a direction perpendicular to the base substrate and configured to emit infrared light; and a first photosensitive device disposed on the base substrate and configured to sense light obtained after the infrared light is reflected.

In some examples, the first light-emitting device includes a first emission layer, a first electrode and a second electrode; the second light-emitting device includes a second light emitting layer; and the first electrode, the first light emitting layer, the second light emitting layer and the second electrode are sequentially stacked in the direction perpendicular to the base substrate.

In some examples, the first light-emitting device emits red light.

In some examples, the first sub-pixel further includes a first transistor electrically connected with the first light-emitting device; and the display panel further comprises a first light-absorbing layer which is disposed on one side of the first transistor away from the base substrate and configured to absorb the infrared light to reduce irradiation of the infrared light to the first transistor.

In some examples, the first light-absorbing layer is disposed between the first transistor and the first light-emitting device and includes a first through hole; and the first transistor is electrically connected with the first light-emitting device via the first through hole.

In some examples, the display panel further comprises: a first insulation layer disposed between the first transistor and the first light-absorbing layer, wherein the first insulation layer includes a second through hole which is communicated with the first through hole to allow the first transistor to be electrically connected with the first light-emitting device.

In some examples, the display panel further comprises a second transistor connected with the first photosensitive device, wherein the first insulation layer further includes a third through hole through which the second transistor is electrically connected with the first photosensitive device.

In some examples, in the direction perpendicular to the base substrate, the first photosensitive device is disposed on one side of the first light-emitting device close to the base substrate.

In some examples, the first light-absorbing layer comprises a first opening; and the first photosensitive device is at least partially overlapped with the first opening in the direction perpendicular to the base substrate to receive, through the first opening, the light obtained after the infrared light is reflected.

In some examples, the display panel further comprises a light shield layer disposed on one side of the first photosensitive device away from the base substrate, wherein the light shield layer is provided with a second opening at a position corresponding to the first photosensitive device to allow the first photosensitive device to receive, through the second opening, the light obtained after the infrared light is reflected.

In some examples, in the direction perpendicular to the base substrate, the first photosensitive device is disposed on one side of the first light-emitting device away from the base substrate.

In some examples, the display panel further comprises a second light-absorbing layer and a second transistor connected with the first photosensitive device, wherein the second light-absorbing layer is disposed between the second light-emitting device and the first photosensitive device and configured to absorb the infrared light to reduce irradiation of the infrared light to the first photosensitive device.

In some examples, the display panel further comprises a second sub-pixel adjacent to the first sub-pixel, wherein the first photosensitive device is disposed between the first sub-pixel and the second sub-pixel.

In some examples, the display panel further comprises a second photosensitive device and a third sub-pixel adjacent to the first sub-pixel, wherein the second photosensitive device is disposed between the first sub-pixel and the third sub-pixel and configured to sense the light obtained after the infrared light is reflected.

In some examples, the wavelength range of the infrared light is 760 nm-9 μm.

At least some embodiments of the present disclosure provides a method for manufacturing a display panel, comprising: providing a base substrate; forming a first sub-pixel on the base substrate, in which the first sub-pixel includes a first light-emitting device which is configured to emit visible light for display operation; forming a second light-emitting device overlapped with the first light-emitting device in a direction perpendicular to the base substrate and configured to emit infrared light; and forming a first photosensitive device on the base substrate, in which the first photosensitive device is configured to sense light obtained after the infrared light is reflected.

In some examples, forming the first light-emitting device and the second light-emitting device includes: forming a first electrode, a first light emitting layer, a charge generation layer, a second light emitting layer and a second electrode on the base substrate in sequence in a stack, wherein the first light emitting layer and the second light emitting layer respectively correspond to the first light-emitting device and the second light-emitting device.

In some examples, forming the first light-emitting device and the second light-emitting device includes: forming a first electrode, a first hole transport layer, a first light emitting layer, a first electron transport layer, a charge generation layer, a second hole transfer layer, a second light emitting layer, a second electron transfer layer and a second electrode on the base substrate in sequence in a stack, wherein the first light emitting layer and the second light emitting layer respectively correspond to the first light-emitting device and the second light-emitting device.

In some examples, the manufacturing method further comprises: forming an electron blocking layer between the first light emitting layer and the first electron transfer layer; and forming a hole blocking layer between the second hole transfer layer and the second light emitting layer.

In some examples, the first light emitting layer, the charge generation layer and the second light emitting layer are formed by evaporation processes.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1A:
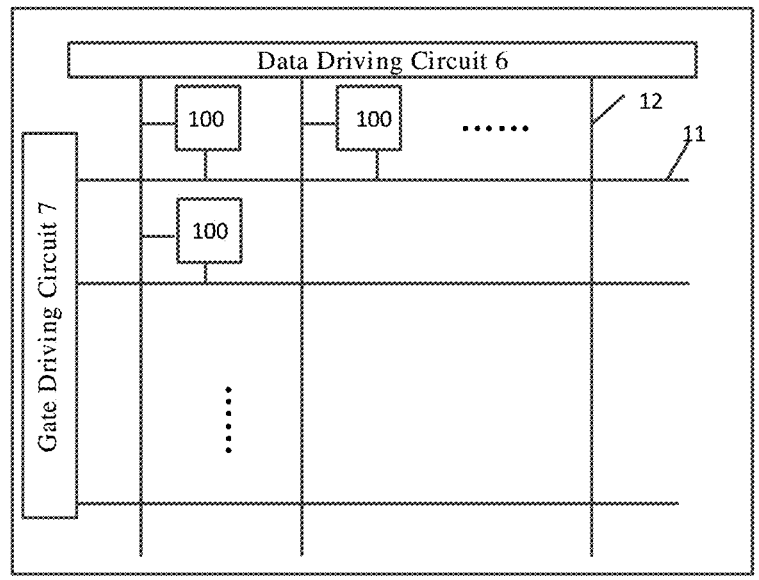
FIG. 1A is a schematic diagram illustrating a circuit for display operation of a display panel provided by some embodiments of the present disclosure.

In the following, technical solutions in embodiments of the present disclosure will be clearly and completely described with reference to the accompanying drawings, and non-limiting example embodiments shown in the drawings and detailed in the following description will be referred to more fully explain the example embodiments of the present disclosure and their various features and advantageous details. It should be noted that the features shown in the figures are not necessarily drawn to scale. Descriptions of known materials, components, and process technologies are omitted from this disclosure so as not to obscure exemplary embodiments of this disclosure. The examples given are only intended to facilitate understanding of the implementation of the exemplary embodiments of the present disclosure and to further enable those skilled in the art to implement the exemplary embodiments. Therefore, these examples should not be construed as limiting the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Furthermore, in various embodiments of the present disclosure, the same or similar reference numerals refer to the same or similar components.

The display panel with a fingerprint recognition function may be in an on-cell structure and an in-cell structure. The on-cell structure refers to that bonding a fingerprint recognition module on the outside of a display panel, for example, disposing the fingerprint recognition module on the back side of the display panel. This structure requires additional production of the fingerprint recognition module, and results in a larger volume of the final product. The in-cell structure refers to that integrating a fingerprint recognition module into a laminated structure of the display panel. This structure can realize full-screen fingerprint recognition. Because this structure involves compatibility issues with the manufacturing process of the display panel, how to manufacture a high signal-to-noise ratio (SNR) fingerprint recognition module and optimize the manufacturing process is an issue to be considered.

At present, in a display panel with an in-cell fingerprint recognition module, original light-emitting devices originally provided in the display panel are usually used as a light source for an optical fingerprint recognition module, which not only affects the display effect of the display panel but also reduces the service life of the light-emitting devices.

At least some embodiments of the present disclosure provide a display panel and a manufacturing method thereof. The display panel integrates a photosensitive device in a display screen and adopts infrared light as a light source for the photosensitive device, and an infrared light-emitting device and a light-emitting device in the display panel that emits visible light for display operation are overlapped with each other in a direction perpendicular to a substrate. The display panel at least has the following advantages: the display panel can realize full-screen fingerprint recognition; as infrared light is invisible light, infrared light will not affect the display effect; as the light-emitting devices originally provided in the display panel are not required to be utilized as the light source, the service life of the light-emitting devices can be prolonged; as the infrared light-emitting devices and the light-emitting devices in the display panel are overlapped with each other, the area of the display panel is not required to be additionally occupied, thereby increasing the distribution area and the distribution density of pixels and improving the aperture area (aperture ratio) and the resolution of the display panel.

Figure 1B:
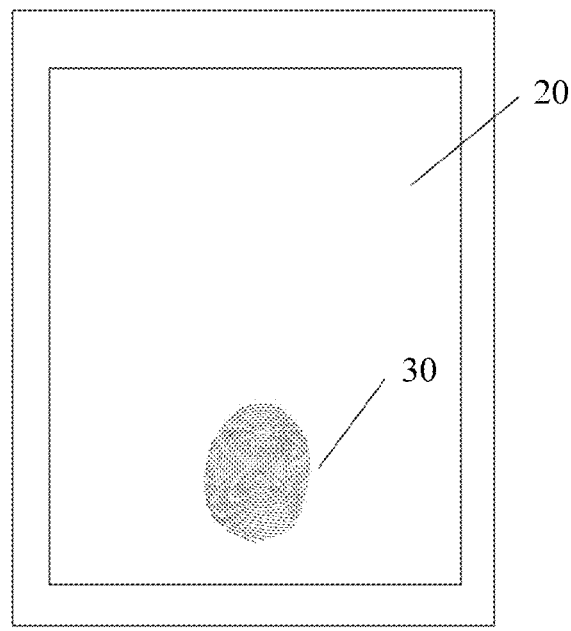
FIG. 1B is a schematic plan view of a display panel provided by some embodiments of the present disclosure.

FIG. 1A is a schematic diagram illustrating a circuit for display operation of a display panel 10 provided by an embodiment of the present disclosure. FIG. 1B is a schematic plan view of the display panel.

As shown in FIG. 1A, the display panel 10 comprises a plurality of gate lines 11, a plurality of data lines 12, and a plurality of pixel units 100 arranged in an array. The plurality of gate lines 11 and the plurality of data lines 12 are intersected with each other to define a plurality of pixel regions. Each pixel unit 100 includes a plurality of sub-pixels for emitting visible light of different colors, e.g., red light, green light and blue light. Each sub-pixel includes a first light-emitting device and a pixel circuit for driving the first light-emitting device to emit light. The first light-emitting device is configured to emit visible light for display operation.

As shown in FIG. 1B, the plurality of pixel units 100 are disposed in a display region 20 of the display panel 10, and the display region 20 includes a fingerprint recognition area 30 which may be part or all of the display region 20.

For instance, the display panel 10 is an OLED display panel, and the first light-emitting device is an OLED; or the display panel 10 is a polymer light-emitting diode (PLED) display panel, and the first light-emitting device is a PLED; or the display panel is a quantum dot light-emitting diode (QLED) display panel, and the first light-emitting device is a QLED. For instance, the pixel circuit includes the conventional 2T1C (namely two transistors and one capacitor) pixel circuit. Moreover, in different embodiments, the pixel circuit may further include a compensating circuit. The compensating circuit includes an internal compensating circuit or an external compensating circuit, and may include transistors, capacitors, etc. For instance, the pixel circuit may further include a reset circuit, an emission control circuit, a detection circuit or the like as required. The type of the first light-emitting device and the specific structure of the pixel circuit are not limited in the embodiments of the present disclosure.

For instance, as shown in FIG. 1A, the display panel may further comprise a data driving circuit 6 and a gate driving circuit 7 which are respectively connected with the pixel units 100 through the data lines 12 and the gate lines 11. The data driving circuit 6 is configured to provide data signals for display operation for sub-pixels in the pixel units 100. The gate driving circuit 7 is configured to provide scanning signals for display operation for the sub-pixels in the pixel units 100 and may also be configured to provide various kinds of control signals, power supply signals, etc.

For instance, in each pixel unit 100, the arrangement mode of the sub-pixels, for example, includes a Δ arrangement, a Real RGB arrangement or a Pentile arrangement. In the Δ arrangement mode, for example, each pixel unit 100 includes three sub-pixels which respectively emit red light, green light and blue light and are arranged in a triangle. In the Real RGB arrangement mode, for example, each pixel unit 100 includes three sub-pixels, and the three sub-pixels include first light-emitting devices that respectively emit red light, green light and blue light and are disposed in the same row or the same column of sub-pixels. For example, in the Pentile arrangement mode, each pixel unit 100 only includes sub-pixels that emit light of two colors; as all the colors are formed by three primary colors (red, green and blue), during display operation, each pixel unit may borrow a sub-pixel that emits light of another color in an adjacent pixel unit to realize full-color display. The arrangement mode of the sub-pixels is not limited in the embodiments of the present disclosure.

The display panel 10 further comprises a second light-emitting device or second light-emitting devices which are configured to emit infrared light (with the wavelength range of 760 nm-1 mm) and used as a light source for fingerprint recognition. As infrared light is invisible light, the display effect will not be affected. Moreover, as the first light-emitting device originally provided in the display panel is not required to be utilized as the light source for fingerprint recognition, the service life of the first light-emitting device is prolonged.

For instance, the infrared light is in a near infrared region, for example, with the wavelength range of 760 nm-9 μm, e.g., with the wavelength of about 940 nm. As the infrared light by a human-body is within the wavelength range of 9-14 μm, the human-body infrared light will not result in dummy signals and disturb the fingerprint recognition. As infrared light with the wavelength of about 940 nm in the solar emission spectrum is the weakest, the wavelength of infrared light emitted by the second light-emitting devices is set to be about 940 nm to better avoid the impact of the solar light on the photosensitive devices. In addition, due to the small energy level gap of infrared luminous materials, near-infrared light can further avoid false signals caused by heat compared with infrared light in other wavelength ranges.

As a second light-emitting device and a first light-emitting device are overlapped with each other in a direction perpendicular to a display surface, the second light-emitting device is disposed in a sub-pixel region provided with the first light-emitting device. This setting helps to increase the distribution area and the distribution density of sub-pixels and then improves the aperture area (aperture ratio) and the resolution of the display panel. In this case, the second light-emitting device may also share a drive circuit with the first light-emitting device, so the production of an independent drive circuit for the second light-emitting device is omitted. As human eyes are insensitive to infrared light, the second light-emitting device may emit light together with the first light-emitting device in the pixel unit.

Figure 2:
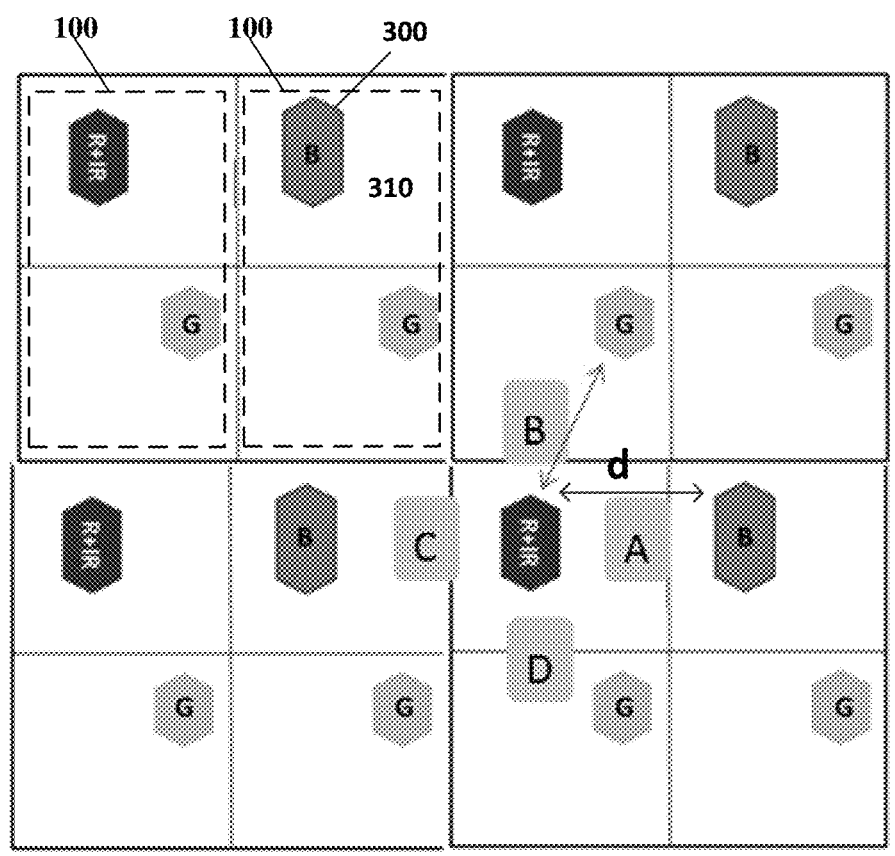
FIG. 2 is a schematic diagram illustrating the pixel arrangement in some embodiments of the present disclosure.

FIG. 2 is a schematic diagram illustrating pixel arrangement in some embodiments of the present disclosure. As shown in FIG. 2, a plurality of sub-pixels 300 adopt a Pentile arrangement mode and are respectively disposed in a plurality of pixel regions 310. Each pixel unit 100 only includes two sub-pixels 300. During display operation, each pixel unit borrows a sub-pixel that emits light of another color in an adjacent pixel unit. Under the same display resolution, the Pentile arrangement mode can reduce the total number of the sub-pixels, increase the area of each sub-pixel region, and reduce the process difficulty, and can have higher pixels per inch (PPI) for the same number of sub-pixels.

As shown in the figure, each pixel unit 100 includes two sub-pixels 300 which respectively emit red light (R) and green light (G); or the two sub-pixels respectively emit blue light (B) and green light (G). For instance, the second light-emitting device is disposed in the sub-pixel region 310 that emits red light, and forms a laminated structure (R+IR) with the first light-emitting device that emits red light, that is, the sub-pixel that emits red light is the first sub-pixel.

The display panel 10 further comprise a first photosensitive device which is configured to sense the light obtained after the infrared light emitted by the second light-emitting devices is reflected by a finger or the palm of a user that touches the surface of the display side of the display panel 10, and convert optical signals corresponding to the reflected light carrying the fingerprint or the palm print information into electrical signals to realize the acquisition of a fingerprint image or a palm print image.

As shown in FIG. 2, spacing areas (namely PDL gaps hereafter) are formed among adjacent sub-pixel regions. Four spacing areas ABCD are respectively formed between one sub-pixel region 310 that emits red light and adjacent sub-pixel regions. The first photosensitive device may be disposed at any spacing area, such as the area A, that is, the first photosensitive device is disposed between the first sub-pixel (R+IR) and an adjacent second sub-pixel (e.g., a sub-pixel that emits blue light in FIG. 2).

For instance, in some embodiments, the display panel 10 further comprises storage capacitors which are configured to store electrical signals generated by the first photosensitive device. For instance, when the first photosensitive device is disposed at the area A, a storage capacitor may be disposed at any one of the three spacing areas BCD.

For instance, each second light-emitting device may be correspondingly provided with a plurality of photosensitive devices to improve the photosensitivity. For instance, the plurality of photosensitive devices are disposed in a plurality of spacing areas, e.g., the area A and the area B, or the area A, the area B and the area C.

For instance, in some examples, the display panel may further comprise a second photosensitive device. The second photosensitive device may be disposed at any spacing area rather than the spacing areas occupied by the first photosensitive device and the storage capacitor. For instance, as shown in FIG. 2, the second photosensitive device is disposed between the first sub-pixel and an adjacent third sub-pixel (e.g., a sub-pixel that emits green light in FIG. 2) and configured to sense the light obtained after the infrared light emitted by the second light-emitting device is reflected together with the first photosensitive device.

In some other examples, the display panel 10 may further comprise a third photosensitive device. In this case, for instance, the first photosensitive device, the second photosensitive device and the third photosensitive device are respectively disposed in the three spacing areas, and the storage capacitor is disposed in the remaining spacing area.

As shown in FIG. 2, the dimension d of the spacing area depends on the distribution density of the sub-pixel, for example, depending on the size of spacers between pixel opening regions in a pixel definition layer (PDL) below. For instance, the dimension d of the spacing area is ranged from 5 μm to 25 μm.

Figure 3:
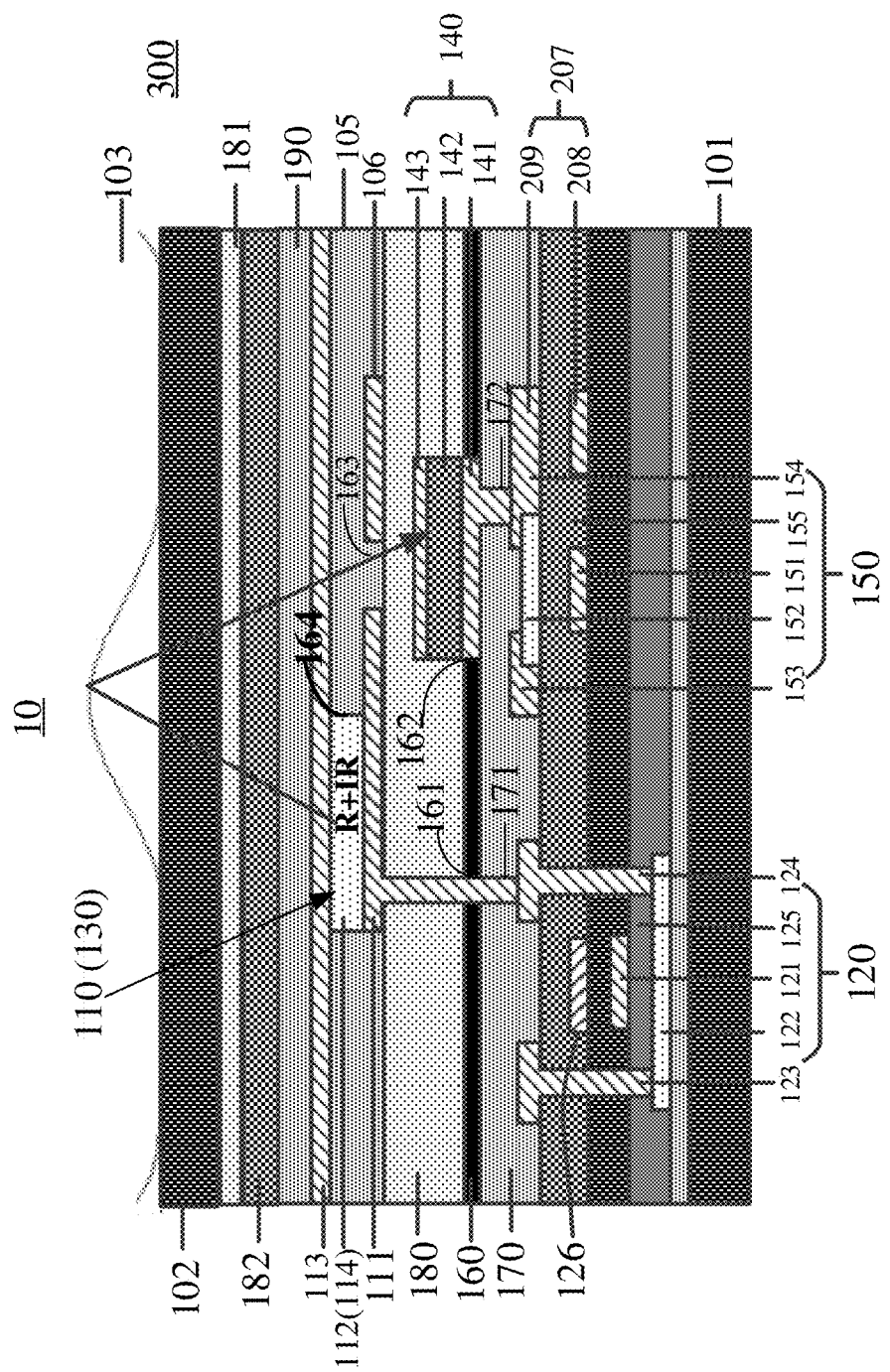
FIG. 3 is a schematic partial sectional view of a fingerprint recognition region of the display panel provided by some embodiments of the present disclosure.

FIG. 3 is a partial sectional view of a fingerprint recognition region of the display panel provided by some embodiments of the present disclosure. As shown in FIG. 3, the display panel 10 comprises a base substrate 101 and sub-pixels 300 (first sub-pixels) disposed on the base substrate 101. For clarity, the figure only shows the first light-emitting device 110 in the first sub-pixel and a first transistor 120 electrically connected with the first light-emitting device 110. For instance, the first transistor 120 may be a driving transistor which is configured to work under the saturated state and control the magnitude of the current that drives the first light-emitting device 110 to emit light. For instance, the first transistor 120 may also be a luminescent control transistor which is configured to control whether the current that drives the first light-emitting device 110 to emit light passes or not. The specific type of the first transistor is not limited in the embodiments of the present disclosure.

For instance, as shown in FIG. 3, the display panel 10 may further comprise a first light-absorbing layer 160 which is disposed on one side of the first transistor 120 away from the base substrate 101 and configured to absorb the irradiation of the infrared light emitted by the second light-emitting device 130 to the first transistor 120. The first light-absorbing layer 160 can protect the transistors in the pixel unit and prevent the irradiation of the infrared light from causing the deterioration of device performances.

For instance, as shown in FIG. 3, the first light-absorbing layer 160 is disposed between the first transistor 120 and the first light-emitting device 110. Thus, both the infrared light emitted downwards by the first light-emitting device 110 and the infrared light reflected by, for instance, a fingerprint, is blocked by the first light-absorbing layer 160 and will not be irradiated to (an active layer of) the first transistor 120, so the first transistor 120 will not be affected by the light reflected by the first light-emitting device 110.

As shown in FIG. 3, the second light-emitting devices 130 and the first light-emitting devices 110 are overlapped with each other in the direction perpendicular to the base substrate 101. This setting can save the occupied area of the second light-emitting devices 130 and then improve the resolution of the display panel 10.

For instance, the first light-emitting device 110 includes a first electrode 111, a first light emitting layer 112 and a second electrode 113 which are overlapped with each other in sequence. The first electrode 111 is electrically connected with the first transistor 120. As shown in FIG. 3, the first light-absorbing layer 160 includes a first through hole 161, and the first transistor 120 is electrically connected with the first electrode 111 of the first light-emitting device 110 via the first through hole 161.

For instance, the second light-emitting device 130 includes a second light emitting layer 114, and the first electrode 111, the first light emitting layer 112, the second light emitting layer 114 and the second electrode 113 are overlapped with each other in the direction perpendicular to the base substrate 101. The second light emitting layer 114 is made from an infrared luminescent material, for example, including phosphorescent complex materials, or rare earth erbium complexes with different organic ligands, such as ternary complex Er(TTA)2PhenMA, binary complex Er(DBM)3MA, or the like.

For instance, at least one electrode of the first light-emitting device 110 is electrically connected with or shared with at least one electrode of the second light-emitting device 130.

Figure 4:
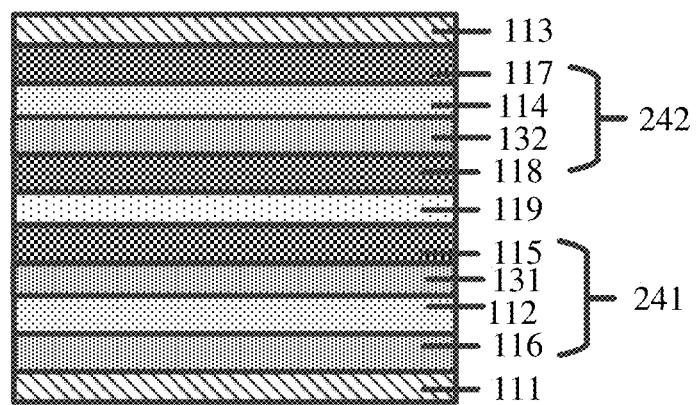
FIG. 4 is a schematic diagram illustrating a tandem structure of a first light-emitting device and a second light-emitting device in some embodiments of the present disclosure.

For instance, the first light-emitting device 110 and the second light-emitting device 130 form a tandem structure. FIG. 4 is a schematic structural view of one example of the tandem structure. As shown in FIG. 4, the tandem structure includes a first stacked body 241 and a second stacked body 242 which are laminated between the first electrode 111 and the second electrode 113. Each stacked body may at least include a hole transfer layer, a light emitting layer and an electron transfer layer. For instance, as shown in FIG. 4, the first stacked body 241 includes a first hole transfer layer 116, the first light emitting layer 112 and a first electron transfer layer 115 of the first light-emitting device 110 which are laminated on the first electrode 111; and the second stacked body 242 includes a second hole transfer layer 118, a second light emitting layer 114 and a second electron transfer layer 117 of the second light-emitting device 130 which are overlapped with each other.

The tandem structure further includes a charge generation layer 119 disposed between the first stacked body 241 and the second stacked body 242. The charge generation layer 119 includes an N-type charge generation layer adjacent to the first stacked body 241 and a P-type charge generation layer disposed on the N-type charge generation layer and arranged adjacent to the second stacked body 242. The N-type charge generation layer may be formed by an organic layer doped with an alkali metal(s) such as lithium (Li), sodium (Na), potassium (K) or cesium (Cs) or an alkaline earth metal(s) such as magnesium (Mg), strontium (Sr), barium (Ba) or radium (Ra) (but not limited to any one of these metals). The P-type charge generation layer may be formed by an organic layer obtained by doping an organic substrate material having a hole transport capacity with a doping agent.

Herein, the first electrode 111 and the second electrode 113 are an anode and a cathode, respectively. In some other examples, the first electrode 111 and the second electrode 113 may also be a cathode and an anode, respectively. In this case, correspondingly, in each stacked body, the positions of the electron transfer layer and the hole transfer layer must be exchanged, and no further description will be given here. In addition, compared with the first stacked body 241 including the first light emitting layer 115, the second stacked body 242 including the second light emitting layer 114 in FIG. 4 is closer to the second electrode 113. However, no limitation will be given here in the embodiments of the present disclosure. The stacking order of the second stacked body 242 and the first stacked body 241 may also be exchanged.

For instance, the first stacked body 241 and the second stacked body 242 may also respectively include an electron blocking layer 131 and a hole blocking layer 132. The electron blocking layer and the hole blocking layer are configured to prevent the movement of hole-and-electron recombination regions in the stacked bodies, so as to improve the emission stability of devices. For instance, the electron blocking layer 131 is disposed between the first light emitting layer 112 and the first electron transfer layer 115, and the hole blocking layer 132 is disposed between the second light emitting layer 114 and the second hole transfer layer 118.

For instance, the first light-emitting device 110 that emits red light in the pixel unit 100 and the second light-emitting device 130 form a tandem structure. Due to that the energy level of red light is close to that of infrared light, the choice for materials such as light emitting layer materials, electron transport materials, hole transport materials, and electrode materials of the light-emitting devices is relatively large, and the implementation difficulty is relatively low. In this case, for instance, each red light-emitting device is correspondingly provided with one second light-emitting device 130 and a first photosensitive device corresponding to the second light-emitting device 130, so the display panel 10 can have a fingerprint recognition function with a pixel-level high-resolution.

For instance, as shown in FIG. 3, the display panel 10 further comprises a first photosensitive device 140 disposed on a first base substrate 101. The first photosensitive device 140 is configured to sense the infrared light that is emitted by the second light-emitting device 130 and reflected by the detected finger or palm on the surface of the display panel, and convert optical signals corresponding to the reflected light into electrical signals, so as to realize the acquisition of a fingerprint image or a palm image for fingerprint recognition, palm print recognition or other functions.

For instance, as shown in FIG. 3, the illustrative first photosensitive device 140 includes a first electrode 141, a second electrode 143, and a light detection layer 142 disposed between the first electrode 141 and the second electrode 143. The light detection layer 142 generates photon-generated carriers under the irradiation of the infrared light. The photon-generated carriers are collected by a photosensitive circuit and converted into electrical signals which are then outputted to an external processing circuit for analysis to obtain the fingerprint image.

For instance, each pixel unit 100 includes at least one first photosensitive device 140, and second electrodes 143 of a plurality of first photosensitive devices 140 are spaced from each other in the display panel 10 and distributed in an array. For instance, the second electrodes 143 are arranged in the same layer and formed by one patterning process. That is to say, the display panel 10 comprises a conductive layer which includes a plurality of electrode patterns, and the plurality of electrode patterns are respectively the second electrodes 143 of the plurality of first photosensitive devices 140.

For instance, the display panel 10 also comprises a second transistor (switching transistor) 150 electrically connected with the first photosensitive device 140.

For instance, as shown in FIG. 3, the second transistor 150 is disposed on one side of the first light-absorbing layer 160 away from the first light-emitting device 110 and the second light-emitting device 130, so the first light-absorbing layer 160 also protects the second transistor 150 from being affected by light illumination.

Figure 5:
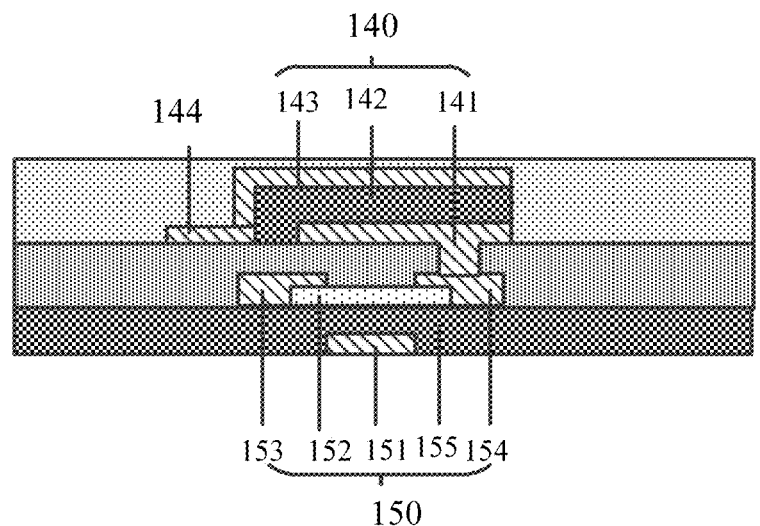
FIG. 5 is a schematic sectional view of a first photosensitive device and a second transistor in some embodiments of the present disclosure.

FIG. 5 is a schematic enlarged sectional view of the first photosensitive device 140 and the second transistor 150 in some embodiments of the present disclosure. As shown in FIG. 5, the display panel 10 also comprises a first lead 144 which is in the same layer with and insulated from the first electrode 141 and configured to be electrically connected with the second electrode 143 to lead the second electrode 143 to another conductive layer for the convenience of wiring. For instance, as shown in FIG. 5, the second electrode 143 is directly lapped onto the first lead 144 to form electrical connection. As the first photosensitive device 140 is disposed at the spacing area between the sub-pixels, the space occupied by the second electrode 143 thereof is limited. The first lead is arranged to lead out the second electrode 143, so as to save the occupied space of the second electrode 143 in a layer provided with the second electrode.

For instance, in this case, the second electrodes 143 of the plurality of first photosensitive devices 140 in the display panel 10 may be formed by forming a whole conductive layer on the base substrate 101 and performing a patterning process on the conductive layer.

The first light-absorbing layer 160 is omitted in FIG. 5. Referring to FIG. 3, when the first light-absorbing layer 160 is formed after the first electrode 141, the first light-absorbing layer 160 is provided with a through hole at a position corresponding to the first lead 144 to expose the first lead 144, so as to allow the electrical connection between the second electrode 143 and the first electrode 141.

For instance, the first photosensitive device 140 may be implemented as a photodiode. In this situation, the light detection layer 142 is, for instance, implemented as a PN junction or a PIN junction, so as to form a PN-type photodiode or a PIN-type photodiode. For instance, the light detection layer 142 may be made from an inorganic material such as germanium-base or silica-base materials. The light detection layer 142 may also be made from an organic material such as a polymer with infrared photosensitive property, mixtures of polymers, a small molecule material, or a small molecule mixture material, for example, a mixture material formed by mixing poly[9-(1-octylnonyl)-9H-carbazole-2,7-diyl]-2, 5-thiophenediyl-2,1,3-benzothiadiazole-4, 7-diyl-2,5-thiophenediyl] (PCDTBT) and [6,6]-phenyl-carbon71-methyl butyrate (PC71BM) at a certain ratio, or a mixture material including zinc metallated porphyrin, PC61BM and pyridine (Zn-metallated porphyrin: PC61BM: pyridine).

For instance, the first photosensitive device 140 may also be implemented as a metal-semiconductor-metal photosensitive device, and the light detection layer 142 forms Schottky contact with the first electrode 141 and the second electrode 143 respectively. For instance, the light detection layer 142 includes at least one of indium gallium arsenide (InGaAs), amorphous silicon, molybdenum sulfide, indium gallium zinc oxide (IGZO), polycrystalline silicon, amorphous selenium, mercury iodide, lead oxide, microcrystalline silicon, nanocrystalline silicon, single crystal silicon, perylene tetra carboxylic-bis-benzimidazole (PTCBI), silicon nanowires, or copper phthalocyanine (CuPc).

For instance, the first photosensitive device 140 may also be implemented as other types of photosensitive devices such as a photosensitive thin-film transistor (TFT). The type of the first photosensitive device 140 is not limited in the embodiments of the present disclosure.

Taking the case that the first photosensitive device 140 is for realizing fingerprint recognition as an example, in the working process, the infrared light emitted by the second light-emitting device 130 is reflected by a surface of a finger 103 and then received by the first photosensitive device 140 and converted into electrical signals. As fingerprint valleys (concave surfaces) and fingerprint ridges (convex surfaces) of the finger 103 have different light reflectivity and reflect light with different intensities, electrical signals with different values are generated. The electrical signals are sent to an external processing circuit (e.g., a fingerprint processing chip, not shown in the drawings) and analyzed to obtain a fingerprint image of the finger surface, and the fingerprint image is subsequently used for fingerprint recognition.

For instance, the plurality of first photosensitive devices 140 respectively receive light reflected by the corresponding areas of the corresponding finger 103 and acquire the fingerprint images of corresponding areas, and then these images are spliced to form a complete fingerprint image.

For instance, in the fingerprint recognition area of the display region, each pixel unit 100 is provided with at least one first photosensitive device 140, that is, the display panel 10 comprises a plurality of first photosensitive devices 140 respectively corresponding to the plurality of pixel units 100. The first photosensitive devices 140 are also arranged in an array to form an image sensor to acquire fingerprint images.

For instance, as shown in FIG. 3, the display panel 10 further comprises a first insulation layer 170 which is disposed between the first transistor 120 and the first light-absorbing layer 160.

For instance, the first insulation layer 170 includes a second through hole 171 which is communicated with the first through hole 161 to allow the electrical connection between the first transistor 120 and the first light-emitting device 110.

For instance, in the direction perpendicular to the base substrate 101, the first photosensitive device 140 is disposed on one side of the first photosensitive device 110 close to the base substrate 101. For instance, an orthographic projection of the first photosensitive device 140 on the base substrate 101 is on the outside of an orthographic projection of the first light-emitting device 110 on the base substrate 101.

For instance, the first insulation layer 170 further includes a third through hole 172 through which the second transistor 150 is electrically connected with the first photosensitive device 140.

For instance, as shown in FIG. 3, the display panel 10 further comprises a second insulation layer 180 which is disposed between the first light-absorbing layer 160 and the first light-emitting device 110.

Relative to the base substrate 101, the first photosensitive device 140 is disposed below the second insulation layer 180, and the first light-emitting device 110 is disposed above the second insulation layer 180. By adoption of this structure, the first photosensitive device 140 is formed before the first light-emitting device 110. As the first light-emitting device 110 generally includes organic materials and has limited tolerant temperature characteristics, compared with the case that the first photosensitive device 140 is formed after or at the same time as the first light-emitting device, the case that the first light-emitting device 140 is formed before the first light-emitting device allows the manufacturing process of the first photosensitive device 140 to be not limited by the tolerant temperature of the first light-emitting device 110, so higher process flexibility can be realized. For instance, the second insulation layer 180 is configured to be a planarization layer, so the first light-emitting device 110 is formed on a flat surface. Meanwhile, as the first photosensitive device 140 is disposed below the first light-emitting device 110, the emission area is not occupied, thereby favorable to improve the aperture ratio of the display panel.

For instance, as shown in FIG. 3, a first opening 162 is also formed in the first light-absorbing layer 160, and the first photosensitive device 140 is at least partially overlapped with the first opening 162 in the direction perpendicular to the base substrate 101, so as to receive the infrared light through the first opening 162.

For instance, the first opening 162 exposes the first electrode 141 of the first photosensitive device 140, and the light detection layer 142 and the second electrode 143 are sequentially disposed on the first electrode 141. In some other embodiments, relative to the base substrate 101, the first photosensitive device 140 is disposed below the first light-absorbing layer 160, and the first photosensitive device 140 and the first opening 162 are at least partially overlapped in the direction perpendicular to the base substrate 101, so that the first photosensitive device 140 is at least partially exposed through the first opening 162 and then can detect the infrared light (reflected through, for example, fingerprint) incident through the first opening 162.

For instance, as shown in FIG. 3, the display panel 10 further comprises a pixel defining layer (PDL) 105 which is disposed on the first electrode 111 of the first light-emitting device 110 and configured to partition the light emitting layers of different sub-pixels so as to prevent the color contamination of the light emitting layers of adjacent sub-pixels in the light-emitting process. As shown in FIG. 3, the PDL 105 is provided with a third opening 164 at a position corresponding to the first electrode 111, and the third opening at least exposes a part of the first electrode 111. The first light emitting layer 112 of the first light-emitting device 110 and/or the second light emitting layer 114 of the second light-emitting device 130 is at least formed in the third opening and contacts with the first electrode 111.

For instance, referring to FIG. 2, the dimension d of the spacing area depends on the distribution density of the sub-pixels, for example, within the range of 5 μm-25 μm.

For instance, the first photosensitive device 140 is arranged corresponding to the spacing area between adjacent third openings 164, namely the first opening 162 in the first light-absorbing layer 160 is arranged corresponding to the spacing area, so as to avoid the light emitting layer of the above-described light-emitting device from shielding the infrared light reflected to the first photosensitive device 140.

For instance, the dimension (side length or diameter) of the first opening 162 is ranged from 5 μm to 25 μm.

For instance, the display panel 10 further comprises a light shield layer 106 disposed on the first photosensitive device 140. The light shield layer 106 is provided with a second opening 163 at a position corresponding to the first photosensitive device 140 to allow the first photosensitive device 140 to receive, through the second opening, the light obtained after the infrared light is reflected 163. For instance, the second opening 163 exposes at least part of the first photosensitive device 140. The second opening 163 is configured to shield stray light at large angles to improve the sensing accuracy of the first photosensitive device 140. For instance, the optical path (including reflected angle and the like) of the infrared light is determined according to the relative position between the second light-emitting device 130 and the first photosensitive device 140, and the light shield layer 106 may be utilized to shield the reflected light at overlarge angles. For instance, the light shield layer 106 may be arranged in the same layer or form an integral structure with the first electrode 111 of the first light-emitting device 110. For instance, the first electrode 111 acts as the light shield layer as well, and the second opening 163 is formed in the first electrode 111.

For instance, the dimension of the second opening 163 should not be too large, otherwise the second opening cannot have the effect of reflecting the stray light; and should not be too small, otherwise the second opening can reduce the sensing sensitivity as the first photosensitive device 140 does not have the enough amount of exposure. For instance, the dimension (side length or diameter) of the second opening 163 is ranged from 1 μm to 15 μm, e.g., about 1.5 μm.

For instance, the first light-emitting device 110 is in a top-emission structure, and the first electrode 111 has reflectivity and the second electrode 113 has transmittance or semi-transmittance. For instance, the first electrode 111 includes a material with a high work function and then acts as an anode, for example, being of an ITO/Ag/ITO laminated structure; and the second electrode 113 includes a material with a low work function and then acts as a cathode, for example, a semi-transmissive metal or metal alloy material, such as Ag/Mg alloy material.

For instance, the first transistor 120 includes a gate electrode 121, a gate insulation layer 125, an active layer 122, a source electrode 123 and a drain electrode 124. The type, the material and the structure of the first transistor 120 are not limited in the embodiments of the present disclosure. For example, the first transistor may adopt a top-gate type, a bottom-gate type or the like. The active layer of the first transistor 120 may be made from an inorganic semiconductor material such as microcrystalline silicon, amorphous silicon, polysilicon (low temperature polysilicon or high temperature polysilicon), oxide semiconductor (such as IGZO), and may also be made from an organic material, e.g., an organic semiconductor material such as poly(2,5-bis(3-alkylthiophene-2-yl)thieno[3,2-b]thiophene) (PBTTT), PDBT-co-TT, PDQT, PDVT-10, dinaphtho-thienothiophene (DNTT) or pentacene. For instance, the first transistor 120 may adopt an N-type or a P-type.

For instance, the second transistor 150 includes a gate electrode 151, a gate insulation layer 155, an active layer 152, a source electrode 153 and a drain electrode 154. The type, the material and the structure of the second transistor 150 are not limited in the embodiments of the present disclosure. For instance, the second transistor may adopt a top-gate type, a bottom-gate type or the like. The active layer of the first transistor 120 may be made from an inorganic semiconductor material such as microcrystalline silicon, amorphous silicon, polysilicon (low temperature polysilicon or high temperature polysilicon), oxide semiconductor (such as IGZO), and may also be made from an organic material such as an organic semiconductor material including poly (2,5-bis(3-alkylthiophene-2-yl)thieno[3,2-b]thiophene) (PBTTT), PDBT-co-TT, PDQT, PDVT-10, dinaphtho-thienothiophene (DNTT) or pentacene. For instance, the second transistor 150 may adopt an N-type or a P-type. For instance, the drain electrode 154 of the second transistor 150 is electrically connected with the first electrode 141 of the first photosensitive device 140.

For instance, the pixel unit 100 further includes a first conductive layer 126 which is overlapped with and spaced from the gate electrode 121 of the first transistor 120 to form a first capacitor, namely one electrode of the first capacitor and the gate electrode 121 of the first transistor are electrically connected and integrally formed. For instance, the first capacitor is taken as one part of the pixel drive circuit and configured to store or maintain the level of the gate electrode 121.

For instance, the gate electrode 151 of the second transistor 150 and the first conductive layer 126 are arranged in the same layer and insulated from each other.

It should be noted that "arranged in the same layer" in the embodiments of the present disclosure means that two or more structures are formed by the same material layer through the same patterning process, and does not necessarily mean that the structures have the same height or are formed on the same surface.

It should be also noted that the source electrode and the drain electrode of the first transistor and the second transistor are symmetrical in physical structure and then may be exchanged according to corresponding circuit connection.

For instance, the display panel 10 further comprises a second capacitor 207. The second capacitor 207 includes a first electrode 208 and a second electrode 209. For instance, as shown in FIG. 3, the first electrode 208 and the gate electrode 151 of the second transistor 150 are arranged in the same layer and insulated from each other, and the second electrode 209 and the drain electrode 154 of the second transistor 150 are arranged in the same layer and electrically connected with each other. For instance, the second electrode 209 of the second capacitor 207 and the drain electrode 154 of the second transistor 150 are integrally formed.

Figure 6:
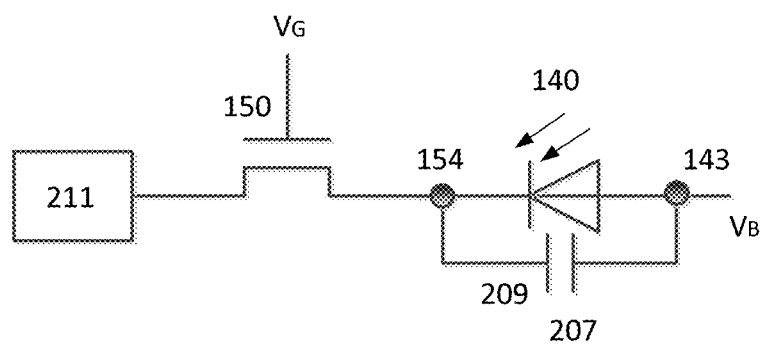
FIG. 6 is a schematic diagram of a photosensitive circuit provided by some embodiments of the present disclosure.

In one example, the second capacitor 207, the second transistor 150 and the first photosensitive device 140 form a photosensitive circuit 210 as shown in FIG. 6. The first photosensitive device 140 is a photodiode.

As shown in FIG. 6, in the photosensitive circuit 210, the anode (corresponding to the first electrode 141) of the first photosensitive device 140 is electrically connected with the drain electrode 154 of the second transistor 150, and the cathode (corresponding to the second electrode 143) of the first photosensitive device 140 is connected with a bias voltage VB. The bias voltage is at a low level, for instance, grounded, so that the first photosensitive device 140 works in the state of being reversely biased. The second electrode 209 of the second capacitor 207 is electrically connected with the first electrode 141 of the first photosensitive device 140, and the first electrode 208 may be connected with a fixed potential, for example, electrically connected with the second electrode 143 of the first photosensitive device 140. The source electrode 153 of the second transistor 150 is connected with an external processing circuit 211, and the gate electrode 151 is connected with a control signal VG.

One working process of the photosensitive circuit 210 includes: in the reset phase, the control signal VG is an ON signal; the second transistor 150 is switched on; and the processing circuit 211 writes a reset signal into the second capacitor 207 through the second transistor 150, so that the second capacitor 207 can be reset. In the photosensitive phase, the control signal VG is an OFF signal; the second transistor 150 is switched off; and the first photosensitive device 140 generates photon-generated carriers under the irradiation of the reflected light and charges the second capacitor 207, so that the second capacitor 207 generates and stores a data voltage Vdata. In the detection phase, the control signal VG is an ON signal; the second transistor 150 is switched on; and the processing circuit 211 reads the data voltage Vdata stored by the second capacitor 207 through the second transistor 150; and then the data voltage is analyzed to form a fingerprint image.

For instance, the processing circuit 211 further processes the data voltage to obtain the fingerprint image, and the fingerprint image may be used in corresponding applications such as system unlocking, mobile payment, etc. The processing circuit may be a digital signal processor (DSP), a central processing unit (CPU) or the like, and may further include a storage unit as required. The specific implementation of the photosensitive circuit 210 and the processing circuit 211 is not limited in the embodiments of the present disclosure.

For instance, the first photosensitive device 140 may also be used for realizing touch sensing, namely used for sensing the touch of a user. For instance, when a finger of the user touches the display panel 10, light emitted by the second light-emitting device 130 is reflected by the surface of the finger and received by the first photosensitive device 140, and converted into electrical signals. An external circuit determines the touch of the finger by detecting the electrical signals, and may also determine the movement direction or the like. No further description will be given here.

For instance, the display panel 10 further comprises a package layer 190 disposed on the second electrode 113 of the first light-emitting device 110 and a cover plate 102. The package layer 190 is configured to seal the light-emitting devices (the first light-emitting devices 110 and the second light-emitting devices 130) to prevent external moisture and oxygen from penetrating the light-emitting devices and the driving circuits to damage the device. For instance, the package layer 109 includes an organic film or a structure formed by organic films and inorganic films that are alternatively stacked. For instance, a water-absorbing layer (not shown) may also be disposed between the package layer 190 and the first light-emitting device 110 and is configured to absorb the residual water vapor or colloidal sol in the light-emitting devices from the previous manufacturing process. The cover plate 102 is, for example, a cover glass. For instance, the cover plate 102 and the package layer 190 may be in an integral structure.

For instance, the display panel 10 may also comprise an optical film such as a polarizing layer disposed on the display side. As shown in FIG. 3, the display panel 10 further comprises a polarizing layer 181. For instance, the polarizing layer 181 is disposed between the cover plate 102 and the package layer 190. For instance, the polarizing layer 181 forms a circular polarizer which includes a linear polarizing layer and a quarter-wave plate which are overlapped with each other. An axis of the quarter-wave plate and a polarizing axis of the linear polarizing layer form a 45° angle. Thus, when passing through the circular polarizer, external light is converted into circularly polarized light. After being reflected back by the electrodes in the display panel, the circularly polarized light is converted into linearly polarized light when passing through the quarter-wave plate at second time. However, the difference between the polarization direction of the linearly polarized light and the polarizing axis of the linear polarizing layer is 90°, the linearly polarized light cannot run through the linear polarizing layer any more. Therefore, the polarizing layer 181 can absorb the external light irradiated towards the display panel, so as to reduce the impact of external ambient light and improve the contrast of the displayed image by the display panel.

For instance, the display panel further comprises a touch structure 182. For instance, the touch structure 182 is disposed between the polarizing layer 181 and the package layer 190. For instance, the touch structure 182 can detect whether the display panel is touched and the touch position. For instance, the type of the touch structure 182 may be of a resistance-type, a capacitance-type, an infrared ray type, a surface sound wave type or the like. For instance, a capacitance-type touch structure may be a self-capacitance type or a mutual-capacitance type. When an external object (such as a finger) approaches, the capacitance of a capacitance-type touch unit will change, so that the touch position of the display panel can be detected. The specific type and the structure of the touch structure are not limited in the embodiments of the present disclosure. In at least one embodiment of the present disclosure, for instance, the touch structure may cooperate with the first photosensitive device 140. For instance, the position touch structure may be configured to detect whether the display panel is touched. If there is touch, the display panel may be switched into a recognition mode, and the first photosensitive device 140 is adopted to acquire a fingerprint image for fingerprint recognition.

The arrangement mode of the touch structure 182 in the display panel 10 is not limited in the embodiments of the present disclosure. For instance, in some embodiments of the present disclosure, the touch structure 182 is bonded to the display side of the display panel. For instance, in some other embodiments of the present disclosure, in the manufacturing process of the display panel, the position touch structure may be formed on the display side of the display panel by a non-bonding method such as deposition or patterning. For instance, as shown in FIG. 3, the touch structure 182 (such as a touch electrode) is directly formed on a surface of the package layer 190.

For instance, the base substrate 101 may be an inorganic base (such as glass, quartz, sapphire, silicon wafer, etc.) or an organic flexible base (such as polyimide (PI), polyethylene terephthalate (PET), polycarbonate, polyethylene, polyacrylate, polyetherimide, polyethersulfone, etc.). The embodiments of the present disclosure includes but not limited to the above examples.

Figure 7:
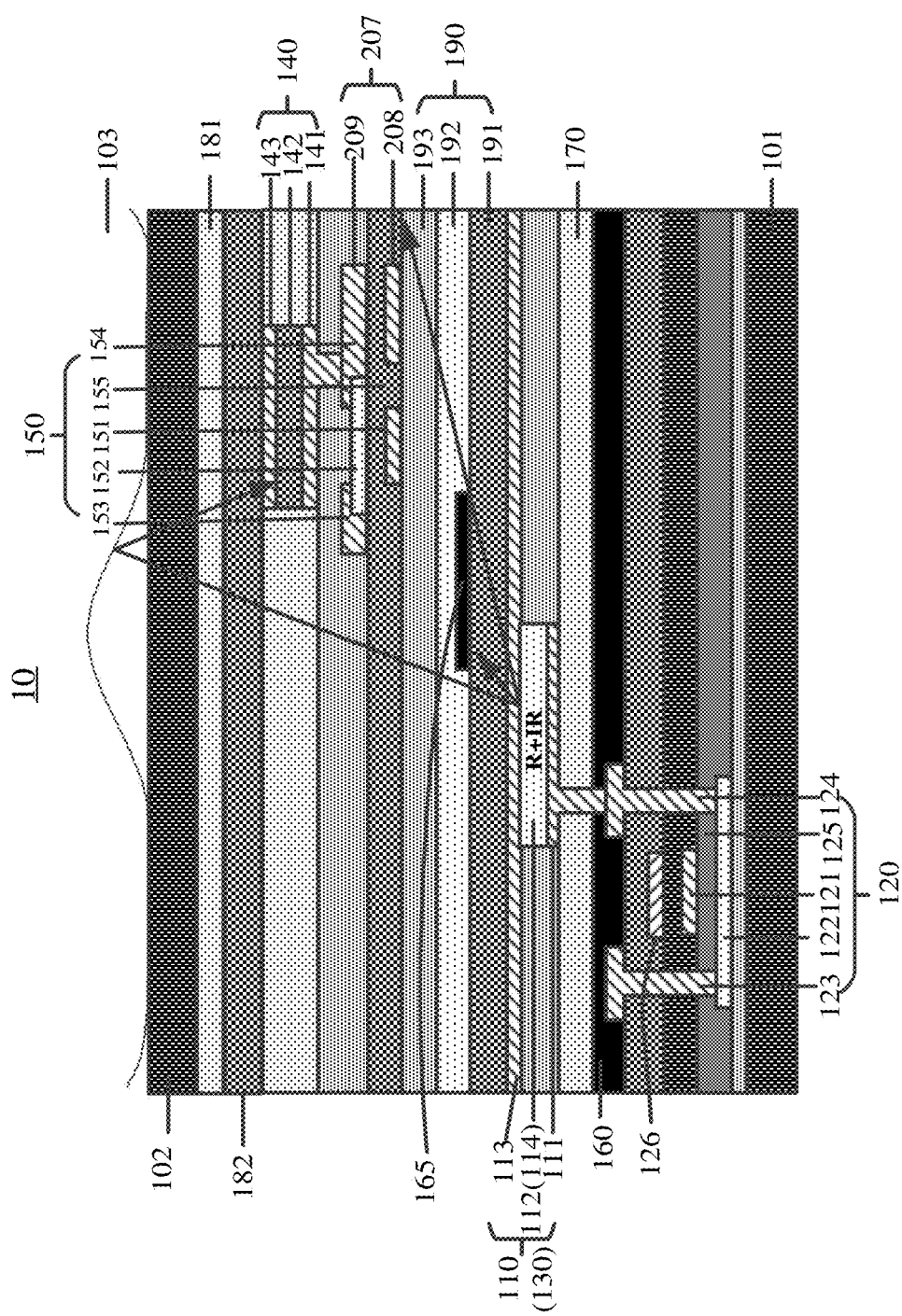
FIG. 7 is a schematic partial sectional view of a fingerprint recognition region of a display panel provided by some other embodiments of the present disclosure.

FIG. 7 is a schematic sectional view of a display panel provided by some other embodiments of the present disclosure. The difference between the display panel provided by this embodiment and the display panel as shown in FIG. 3 lies in that in the direction perpendicular to the base substrate 101, the first photosensitive device 140 is disposed on one side of the first light-emitting device 110 away from the base substrate 101. In this arrangement mode, the first photosensitive device 140 is closer to the cover plate 102, that is, closer to the finger 103 to be detected, so as to reduce the shielding of other layer structures upon the first photosensitive device 140, and then the first photosensitive device 140 has a higher amount of exposure and sensing sensitivity.

For instance, as shown in FIG. 7, the second transistor 150 electrically connected with the first photosensitive device 140 is also disposed on one side of the first photosensitive device 110 away from the base substrate 101.

For instance, the display panel 10 further comprises a second light-absorbing layer 165 which is disposed between the second light-emitting device 130 and the first photosensitive device 140 and configured to absorb the infrared light emitted by the second light-emitting device 130 so as to reduce irradiation of the infrared light to the first photosensitive device 140, thereby reducing the impact on fingerprint signals caused by the fact that the infrared light emitted by the second light-emitting device 130 is directly irradiated to the first photosensitive device 140. In addition, the second light-absorbing layer 165 can reduce the irradiation of the infrared light emitted by the second light-emitting device 130 to (the active layer of) the second transistor 150 so as to protect the second transistor and avoid the deterioration of device performances caused by the infrared light.

For instance, the package layer 190 includes a first package layer 191, a second package layer 192 and a third package layer 193 which are overlapped with each other. For instance, the first package layer 191 and the third package layer 193 include inorganic materials, and the second package layer 192 is disposed between the first package layer 191 and the third package layer 193 and is made from an organic material. As the compactness of the inorganic materials is higher than that of the organic material, the material of the outer layer of the package layer 190 is set to be an inorganic material to more effectively prevent the intrusion and penetration of water vapor, and the material of the second package layer 192 in the middle is set to be an organic material to facilitate the forming of a flat interface.

For instance, as shown in FIG. 7, the second light-absorbing layer 165 is set in a specific area to prevent the irradiation of the infrared light emitted by the second light-emitting device 130 to the second transistor 150, and at the same time, not affect the transmission path in which the infrared light is reflected by the finger to the first photosensitive device 140.

For instance, as shown in FIG. 7, the second light-absorbing layer 165 is disposed between the first package layer 191 and the second package layer 192. For instance, the second light-absorbing layer 165 may also be disposed between the second package layer 192 and the third package layer 193.

For instance, the materials of the first light-absorbing layer 160 and the second light-absorbing layer 165 are black organic materials such as black matrix (BM) materials or black resin materials, and may also be dark-colored inorganic oxide materials. In some examples, the materials of the first light absorbing layer 160 and the second light absorbing layer 165 are PI materials doped with carbon black particles. The materials of the first light-absorbing layer 160 and the second light-absorbing layer 165 may be same or different.

Some embodiments of the present disclosure further provide a manufacturing method of the above display panel 10. The method includes: providing a base substrate; forming a first sub-pixel on the base substrate, in which the first sub-pixel includes a first light-emitting device which is configured to emit visible light for display operation; forming a second light-emitting device overlapped with the first light-emitting device in a direction perpendicular to the base substrate and configured to emit infrared light; and forming a first photosensitive device on the base substrate, in which the first photosensitive device is configured to sense light obtained after the infrared light is reflected.

Illustrative description will be given below to the manufacturing process of the display panel provided by the embodiment of the present disclosure with reference to FIGS. 3 and 7. In the embodiments of the present disclosure, same devices adopt same reference numbers. No further description will be given here.

In some embodiments, referring to FIG. 3, the manufacturing method comprises the following steps S31-S35.

Step S31: forming a pixel drive circuit of a first light-emitting device 110 on a base substrate 101. The pixel drive circuit is configured to drive the first light-emitting device 110 to emit light. For instance, the forming of the pixel drive circuit includes forming a first transistor 120, for instance, which includes forming an active layer 122, a gate insulation layer 125, a gate electrode 121, a first interlayer insulating layer, a first conductive layer 126, a second interlayer insulating layer, and a source/drain electrode layer (including a source electrode 123 and a drain electrode 124) on the base substrate 101 in sequence.

For instance, a gate electrode 151 of a second transistor 150 is formed at the same time when the first conductive layer 126 is formed, that is, the gate electrode 151 of the second transistor 150 and the first conductive layer 126 are formed by the same conductive material through same one patterning process.

For instance, a first electrode 208 of a second capacitor 207 is also formed at the same time when the first conductive layer 126 is formed.

For instance, an active layer 152 of the second transistor 150 is formed between forming of the second interlayer insulating layer and forming of the source/drain electrode layer of the first transistor 120.

For instance, a source/drain electrode layer (including a source electrode 153 and a drain electrode 154) of the second transistor 150 is also formed at the same time when the source/drain electrode layer of the first transistor 120 is formed, that is, the source/drain electrode layer of the second transistor 150 and the source/drain electrode layer of the first transistor 120 are formed by the same conductive material through same one patterning process.

For instance, a second electrode 209 of the second capacitor 207 is also formed at the same time when the source/drain electrode layer of the first transistor 120 is formed. For instance, the second electrode 209 and the drain electrode 154 of the second transistor 150 are electrically connected with each other or in an integral structure.

Step S32: forming a first insulation layer 170 on the first transistor 150, and forming a third through hole 172 in the first insulation layer 170, in which the third through hole 172 exposes at least part of the drain electrode 154 of the second transistor 150; and forming a first electrode 141 of a first photosensitive device 140 on the first insulation layer 170, in which the first electrode 141 is electrically connected with the drain electrode 154 of the second transistor 150 via the third through hole 172.

Step S33: forming a first light-absorbing layer 160 on the first electrode 141 of the first photosensitive device 140, and forming a first opening 162 in the first light-absorbing layer 160, in which the first opening 162 exposes the first electrode 141.

Step S34: sequentially forming a light detection layer 142 and a second electrode 143 on the first electrode 141 of the first photosensitive device 140 to form the first photosensitive device 140, forming a second insulation layer 180 on the first photosensitive device 140, and forming a fourth through hole in the second insulation layer 180, forming a first through hole 161 in the first light-absorbing layer 160, and forming a second through hole 171 in the first insulation layer 170 by patterning process.

Step S35: forming a first electrode 111 of the first light-emitting device 110 on the second insulation layer 180, forming a PDL 105 on the first electrode 111, forming a third opening 164 in the PDL corresponding to the first electrode 111, and sequentially forming a first light emitting layer 112 of the first light-emitting device 110, a second light emitting layer 114 of a second light-emitting device 130, and a second electrode 113 on the first electrode 111 to form the first light-emitting device 110 and the second light-emitting device 130.

For instance, a light shield layer 106 may also be formed at the same time when the first electrode 111 is formed. An electrode material layer is formed and subjected to a patterning process to form the first electrode 111 and the light shield layer 106 of the first light-emitting device 110. The light shield layer is provided with a second opening 163 at a position corresponding to the first photosensitive device 140. For instance, the second opening 163 may form an integral structure with the light shield layer and the first electrode 111.

For instance, referring to FIG. 4, a first hole transfer layer 116, a first light emitting layer 112, a first electron transfer layer 115, a charge generation layer 119, a second hole transfer layer 118, a second light emitting layer 114, a second electron transfer layer 117 and a second electrode 113 are sequentially formed on the first electrode 111.

For instance, the manufacturing process further comprises: forming an electron blocking layer 131 between the first light emitting layer 112 and the first electron transfer layer 151, and forming a hole blocking layer 132 between the second hole transfer layer 118 and the second light emitting layer 114.

For instance, physical vapor deposition (PVD) (such as sputtering) may be adopted to form the first electrode 111, and evaporation process may be adopted to form the first hole transfer layer 116, the first light emitting layer 112, the first electron transfer layer 115, the charge generation layer 119, the second hole transfer layer 118, the second light emitting layer 114, the second electron transfer layer 117, the second electrode 113, the electron blocking layer 131, the hole blocking layer 132 and the like.

For instance, a fine metal mask (FFM) is adopted to form the first light emitting layer 112 and the second light emitting layer 114. The FFM has high precision. By adoption of the FFM to form the light emitting layer, the display panel can have high yield and resolution.

For instance, a package layer 190 may be further formed on the panel structures obtained above to seal the light-emitting device, and a cover plate 102 is bonded. No further description will be given here.

For instance, the material of the first electrode 111 of the first light-emitting device 110 has reflectivity, and meanwhile, has a high work function so as to facilitate the injection of holes into the light emitting layer, for example, in an ITO/Ag/ITO laminated structure.

For instance, the second electrode 113 of the first light-emitting device 110 and the second electrode 143 of the first photosensitive device 140 have transmittance, for example, being of transparent conductive metal oxide such as indium tin oxide (ITO), indium zinc oxide (IZO), zinc oxide (ZnO) or aluminum zinc oxide (AZO).

For instance, the base substrate 101 may be an inorganic base (such as glass, quartz, sapphire, silicon wafer, etc.) or an organic flexible base (such as PI, PET, polycarbonate, polyethylene, polyacrylate, polyetherimide, polyethersulfone, etc.). The embodiments of the present disclosure includes but not limited to the above examples.

For instance, the materials of the above insulation layer may be inorganic insulating materials such as silicon oxide, silicon nitride, silicon oxynitride and other oxides of silicon, nitride of silicon or oxynitride of silicon, or aluminum oxide, titanium nitride and other insulating materials including metal devices, and may also be organic insulating materials such as acrylic acid or polymethyl methacrylate (PMMA).

In some other embodiments, referring to FIG. 7, the difference between this manufacturing process and the manufacturing process provided by the above embodiments lies in that the second transistor 150 and the first photosensitive device 140 are formed on the light-emitting device after the pixel drive circuit, the first light-emitting device and the second light-emitting device are formed on the base substrate 101 by a similar method.

For instance, the manufacturing process comprises: forming the package layer 190 and a second light-absorbing layer 165 on the second electrode 113 of the first light-emitting device 110.

For instance, forming of the package layer 190 includes: sequentially forming a first package layer 191, a second package layer 192 and a third package layer 193 on the second electrode 113 of the first light-emitting device 110.

For instance, the second light-absorbing layer 165 is formed between the first package layer 191 and the second package layer 192. For instance, the second light-absorbing layer 165 may also be formed between the second package layer 192 and the third package layer 193.

For instance, the second transistor 150 and the first photosensitive device 140 are formed on the third package layer 193. For instance, both the process temperature for forming the second transistor 150 and the process temperature for forming the first photosensitive device 140 are lower than 100° C.

For instance, the active layer 152 of the second transistor 150 is made from an organic material, e.g., an organic semiconductor material such as poly(2,5-bis(3-alkylthiophene-2-yl)thieno[3,2-b]thiophene) (PBTTT), PDBT-co-TT, PDQT, PDVT-10, dinaphtho-thienothiophene (DNTT) or pentacene.

For instance, a solution method is adopted to form the layer structures of the second transistor 150 and the first photosensitive device 140. The solution method allows the material layers to be formed under relatively low temperatures, so that the organic light-emitting devices formed previously will not be damaged.

What are described above is related to the illustrative embodiments of the disclosure only and not limitative to the scope of the disclosure; and the scopes of the disclosure are defined by the accompanying claims.

What is claimed is:

1. A display panel, comprising:
a base substrate;
a first sub-pixel disposed on the base substrate and comprising a first light-emitting device configured to emit visible light for display operation;
a second a light-emitting device overlapped with the first light-emitting device in a direction perpendicular to the base substrate and configured to emit infrared light; and
a first photosensitive device disposed on the base substrate and configured to sense light obtained after the infrared light is reflected,
wherein the first sub-pixel further comprises a first transistor electrically connected with the first light-emitting device;
the display panel further comprises a first light-absorbing layer which is disposed on one side of the first transistor away from the base substrate and configured to absorb the infrared light to reduce irradiation of the infrared light to the first transistor; and
a material of the first light-absorbing layer is a black organic material or a dark-colored inorganic oxide material.

2. The display panel according to claim 1, wherein the first light-emitting device comprises a first light emitting layer, a first electrode and a second electrode; the second light-emitting device comprises a second light emitting layer; and
the first electrode, the first light emitting layer, the second light emitting layer and the second electrode are sequentially stacked in the direction perpendicular to the base substrate.

3. The display panel according to claim 1, wherein the first light-emitting device emits red light.

4. The display panel according to claim 1, wherein the first light-absorbing layer is disposed between the first transistor and the first light-emitting device and comprises a first through hole; and
the first transistor is electrically connected with the first light-emitting device via the first through hole.

5. The display panel according to claim 4, further comprising:
a first insulation layer disposed between the first transistor and the first light-absorbing layer,
wherein the first insulation layer comprises a second through hole which is communicated with the first through hole to allow the first transistor to be electrically connected with the first light-emitting device.

6. The display panel according to claim 5, further comprising a second transistor connected with the first photosensitive device,
wherein the first insulation layer further comprises a third through hole through which the second transistor is electrically connected with the first photosensitive device.

7. The display panel according to claim 1, wherein in the direction perpendicular to the base substrate, the first photosensitive device is disposed on one side of the first light-emitting device close to the first transistor.

8. The display panel according to claim 7, wherein the first light-absorbing layer comprises a first opening; and
the first photosensitive device is at least partially overlapped with the first opening in the direction perpendicular to the base substrate to receive, through the first opening, the light obtained after the infrared light is reflected.

9. The display panel according to claim 1, wherein in the direction perpendicular to the base substrate, the first photosensitive device is disposed on one side of the first light-emitting device away from the base substrate.

10. The display panel according to claim 9, further comprising a second light-absorbing layer and a second transistor connected with the first photosensitive device,
wherein the second light-absorbing layer is disposed between the second light-emitting device and the first photosensitive device and configured to absorb the infrared light to reduce irradiation of the infrared light to the first photosensitive device.

11. The display panel according to claim 1, further comprising a second sub-pixel adjacent to the first sub-pixel,
wherein the first photosensitive device is disposed between the first sub-pixel and the second sub-pixel.

12. The display panel according to claim 11, further comprising a second photosensitive device and a third sub-pixel adjacent to the first sub-pixel,
wherein the second photosensitive device is disposed between the first sub-pixel and the third sub-pixel and configured to sense the light obtained after the infrared light is reflected.

13. The display panel according to claim 1, wherein the wavelength range of the infrared light is 760 nm-9 μm.

14. The display panel according to claim 7, wherein the first light-absorbing layer comprises a first opening; and
the first photosensitive device comprises a first electrode, a second electrode, and a light detection layer disposed between the first electrode and the second electrode,
the first opening exposes the first electrode of the first photosensitive device, and the light detection layer and the second electrode are sequentially provided on the first electrode and above the first light-absorbing layer.

15. The display panel according to claim 1, wherein the first photosensitive device comprises a first electrode, a second electrode, and a light detection layer disposed between the first electrode and the second electrode,
the display panel further comprises a first lead which is in a same layer with and insulated from the first electrode and configured to be electrically connected with the second electrode.

16. The display panel according to claim 2, further comprising a pixel defining layer which is disposed on the first electrode of the first light-emitting device and configured to partition light emitting layers of different sub-pixels,
the pixel defining layer is provided with an opening at a position corresponding to the first electrode, and the opening at least exposes a part of the first electrode, and
at least one selected from the group consisting of the first light emitting layer of the first light-emitting device and the second light emitting layer of the second light-emitting device is at least formed in the opening.

17. The display panel according to claim 10, further comprising a storage capacitor,
wherein the storage capacitor comprises a first electrode and a second electrode;
the first electrode of the storage capacitor is in a same layer and of a same material as and insulated from a gate electrode of the second transistor; and
the second electrode of the storage capacitor is in a same layer and of a same material as and electrically connected with a drain electrode of the second transistor.

18. A display panel, comprising:
a base substrate;
a first sub-pixel disposed on the base substrate and comprising a first light-emitting device configured to emit visible light for display operation;
a second a light-emitting device overlapped with the first light-emitting device in a direction perpendicular to the base substrate and configured to emit infrared light; and
a first photosensitive device disposed on the base substrate and configured to sense light obtained after the infrared light is reflected,
wherein the display panel further comprises a light shield layer disposed on one side of the first photosensitive device away from the base substrate;
the light shield layer is provided with an opening at a position corresponding to the first photosensitive device to allow the first photosensitive device to receive, through the opening, the light obtained after the infrared light is reflected.

19. The display panel according to claim 18, wherein the first light-emitting device comprises a first light emitting layer, a first electrode and a second electrode; and
the shielding layer is in a same layer and of a same material as the first electrode of the first light-emitting device.

* * * * *